United States Patent
Lin et al.

(10) Patent No.: US 9,252,092 B2
(45) Date of Patent: Feb. 2, 2016

(54) SEMICONDUCTOR DEVICE AND METHOD OF FORMING THROUGH MOLD HOLE WITH ALIGNMENT AND DIMENSION CONTROL

(71) Applicant: STATS ChipPAC, Ltd., Singapore (SG)

(72) Inventors: Yaojian Lin, Singapore (SG); Kang Chen, Singapore (SG); Yu Gu, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 0 days.

(21) Appl. No.: 13/950,122

(22) Filed: Jul. 24, 2013

(65) Prior Publication Data
US 2015/0028471 A1 Jan. 29, 2015

(51) Int. Cl.
| H01L 21/00 | (2006.01) |
| H01L 23/48 | (2006.01) |
| H01L 23/498 | (2006.01) |
| H01L 21/66 | (2006.01) |
| H01L 23/00 | (2006.01) |

(52) U.S. Cl.
CPC .......... *H01L 23/49811* (2013.01); *H01L 22/12* (2013.01); *H01L 22/20* (2013.01); *H01L 23/49838* (2013.01); *H01L 24/19* (2013.01); *H01L 24/96* (2013.01); *H01L 24/97* (2013.01); *H01L 2224/12105* (2013.01); *H01L 2924/01322* (2013.01); *H01L 2924/13091* (2013.01); *H01L 2924/181* (2013.01); *H01L 2924/18162* (2013.01)

(58) Field of Classification Search
CPC .............. H01L 2924/00; H01L 51/524; H01L 51/5237; H01L 2224/33155; H01L 2225/06548; H01L 2924/181; H01L 23/49811; H01L 23/49838; H01L 24/19; H01L 24/97; H01L 2224/12105; H01L 2924/18162
USPC .................... 257/E23.001–E23.194, E25.006, 257/E25.013, E25.021, E25.027, 666–733, 257/773–796; 438/15, 106, 121, 122, 124, 438/126, 127
See application file for complete search history.

(56) References Cited

U.S. PATENT DOCUMENTS

| 8,012,797 | B2 * | 9/2011 | Shen et al. ..................... 438/107 |
| 8,072,059 | B2 | 12/2011 | Shim et al. |
| 8,125,072 | B2 * | 2/2012 | Lachner et al. ............... 257/693 |
| 8,829,686 | B2 * | 9/2014 | Hong et al. ................... 257/777 |
| 2011/0129960 | A1 | 6/2011 | Park et al. |
| 2011/0278736 | A1 | 11/2011 | Lin et al. |
| 2013/0154108 | A1 | 6/2013 | Lin et al. |

* cited by examiner

*Primary Examiner* — Jasmine Clark
(74) *Attorney, Agent, or Firm* — Robert D. Atkins; Patent Law Group: Atkins and Associates, P.C.

(57) ABSTRACT

A semiconductor device includes a semiconductor die and an encapsulant formed over a first surface of the semiconductor die and around the semiconductor die. A first insulating layer is formed over a second surface of the semiconductor die opposite the first surface. A plurality of conductive vias is formed through the first insulating layer. A conductive pad is formed over the encapsulant. An interconnect structure is formed over the semiconductor die and encapsulant. A first opening is formed in the encapsulant to expose the conductive vias. The conductive vias form a conductive via array. The conductive via array is inspected through the first opening to measure a dimension of the first opening and determine a position of the first opening. The semiconductor device is adjusted based on a position of the conductive via array. A conductive material is formed in the first opening over the conductive via array.

29 Claims, 12 Drawing Sheets

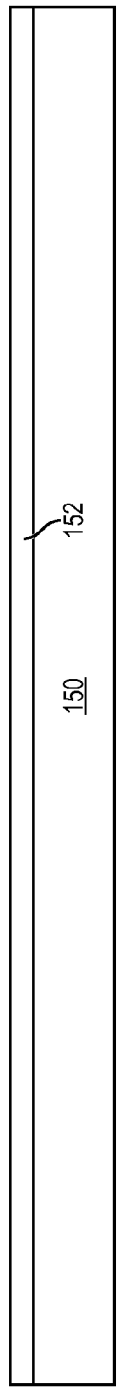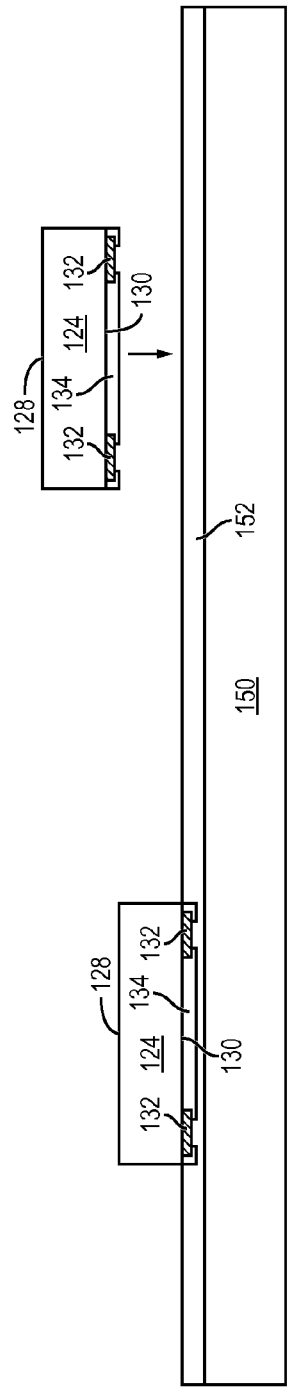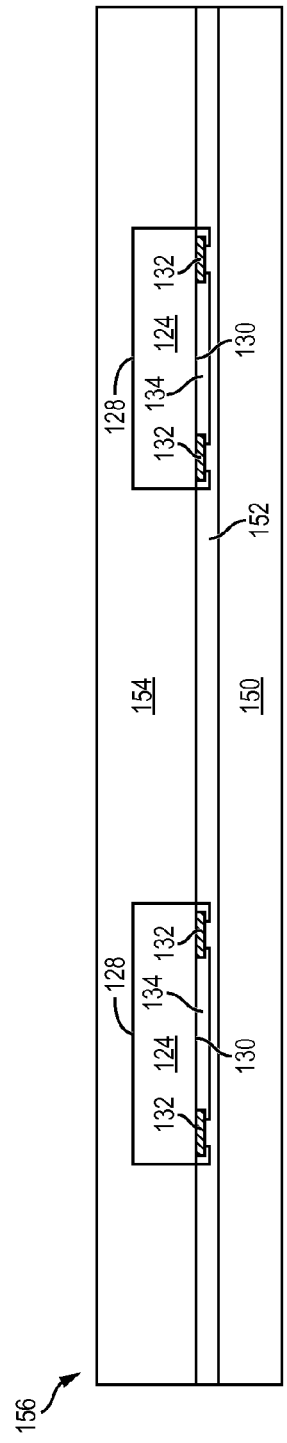
FIG. 4a
FIG. 4b
FIG. 4c

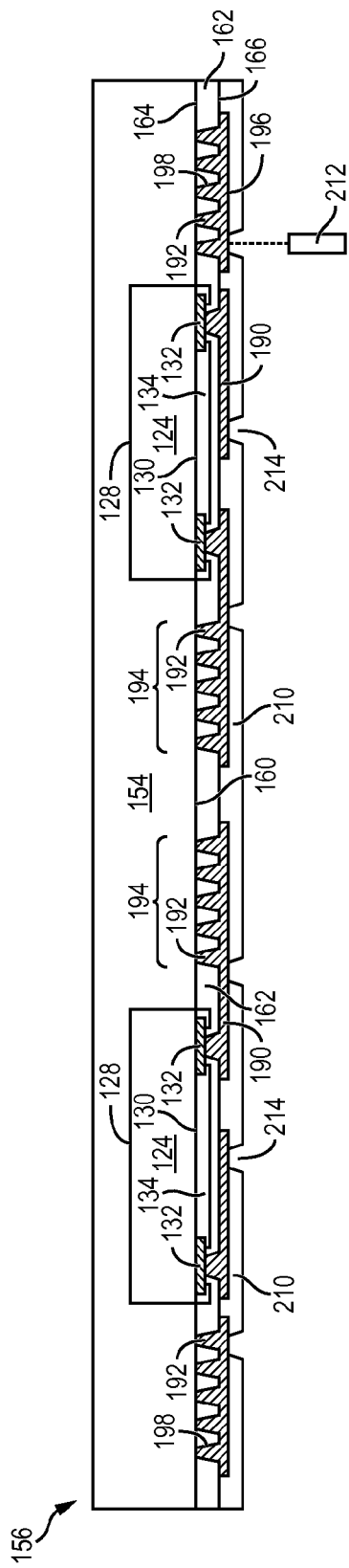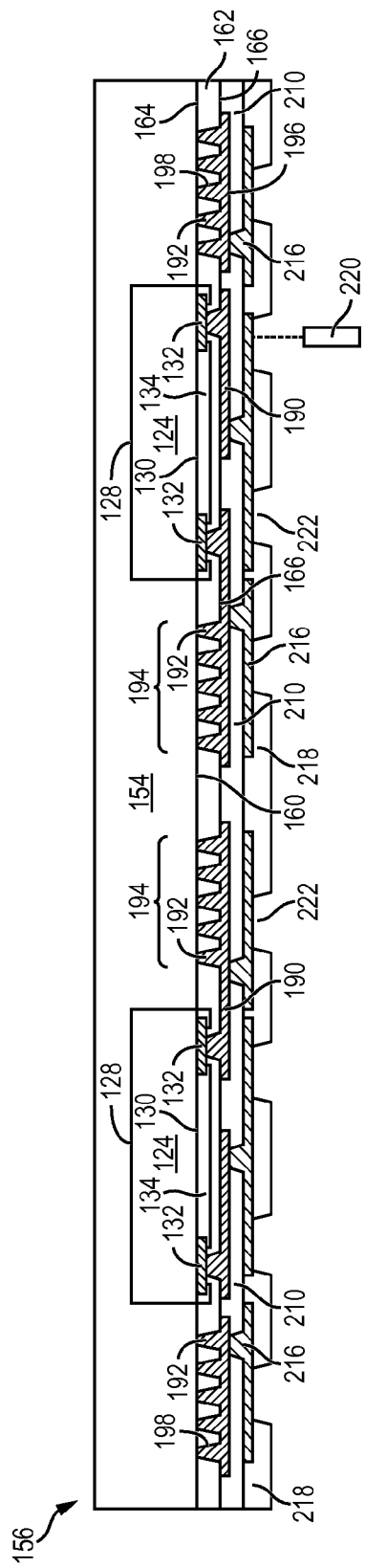

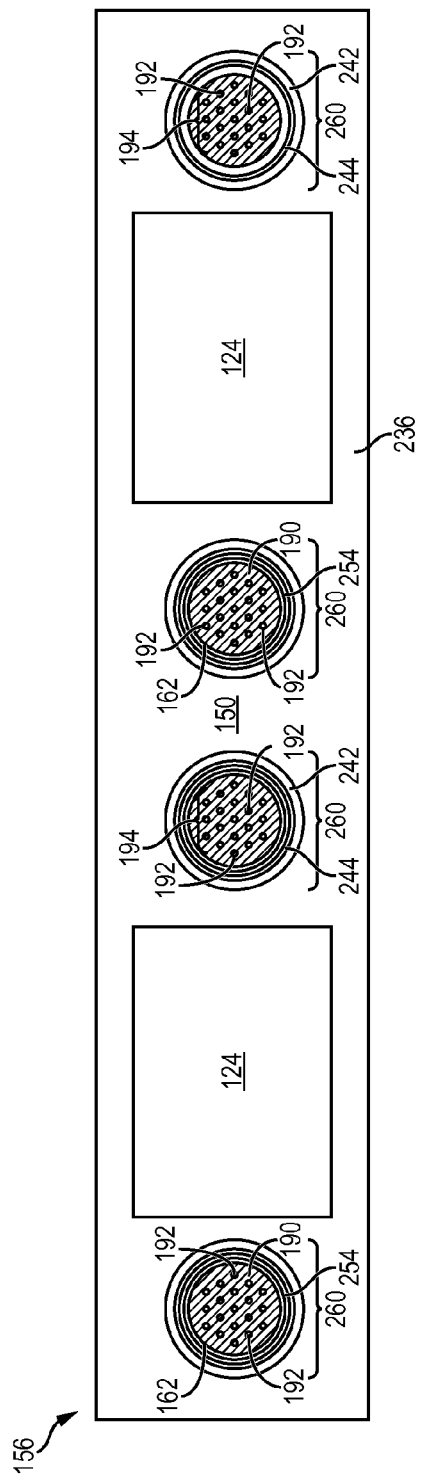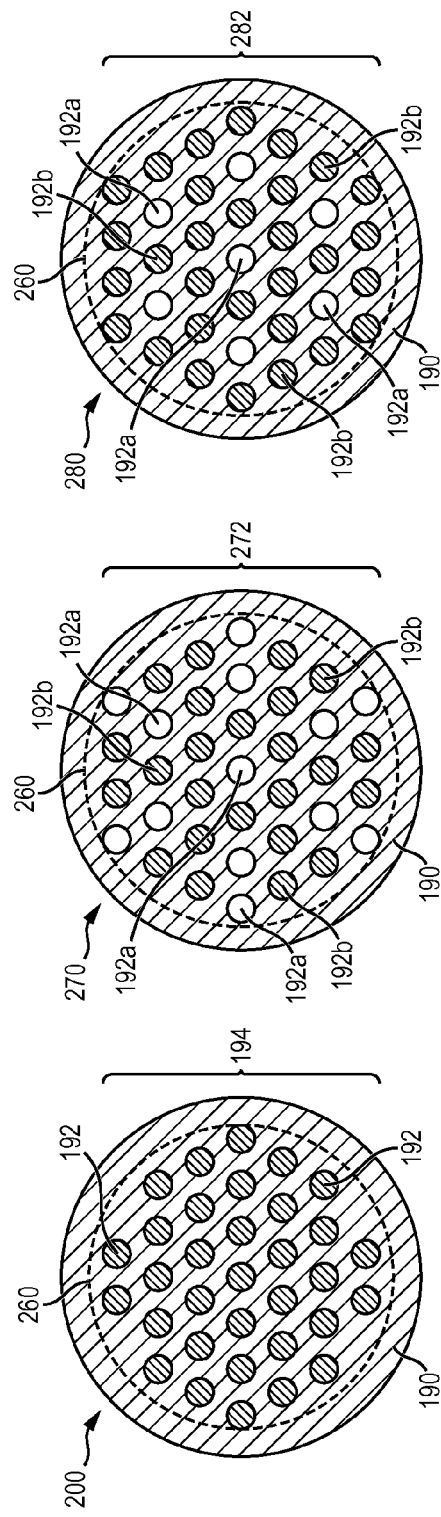

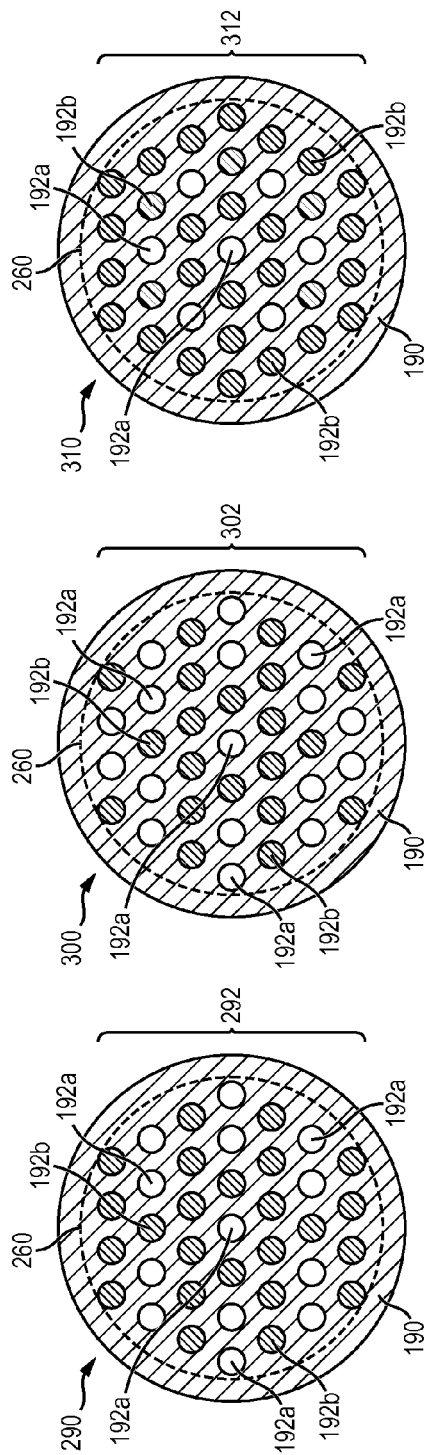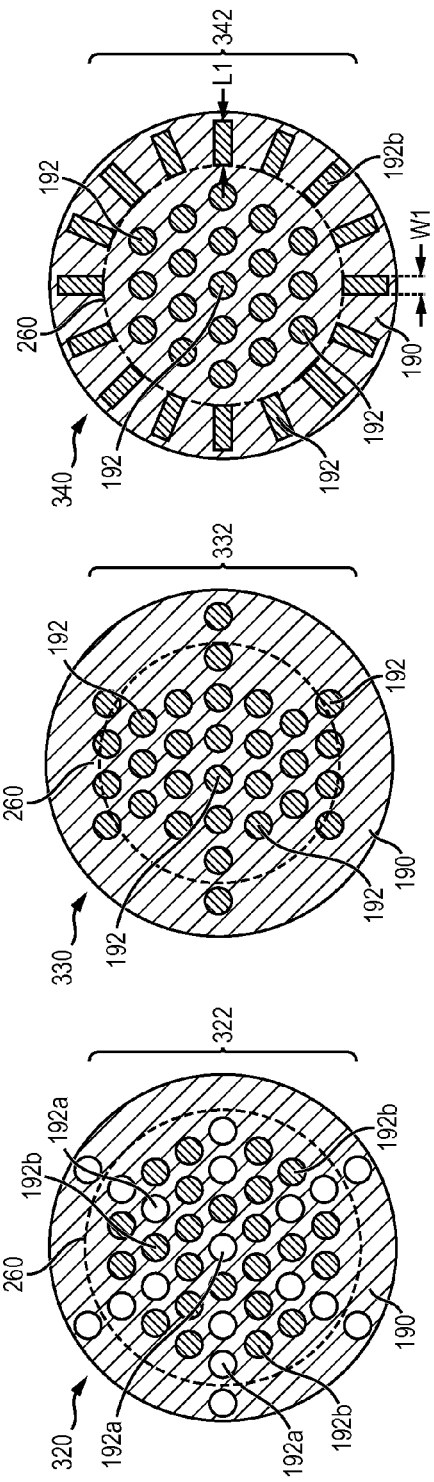

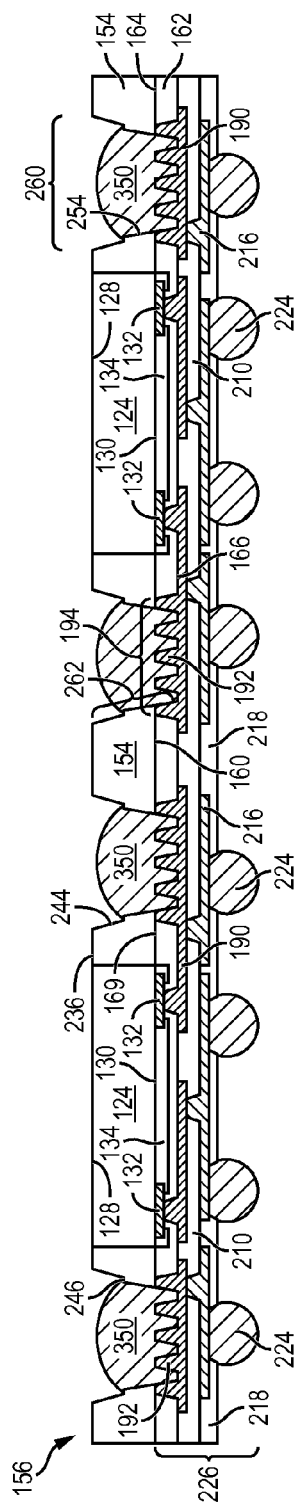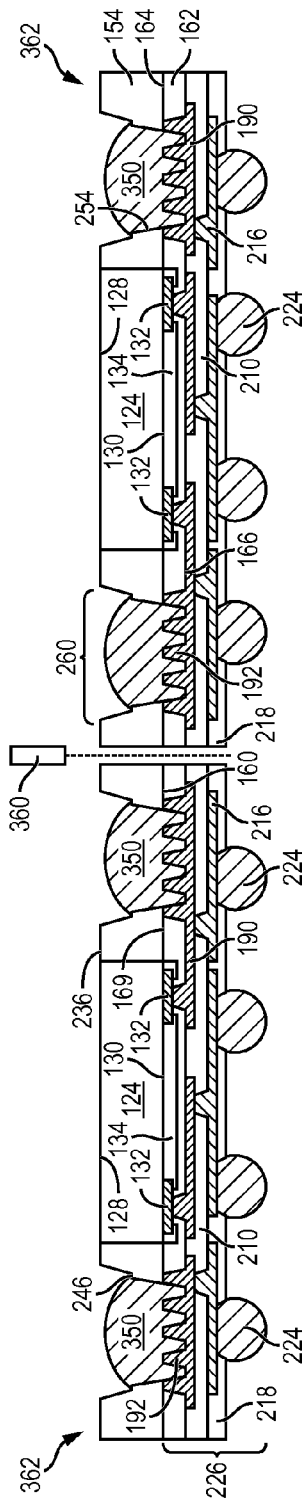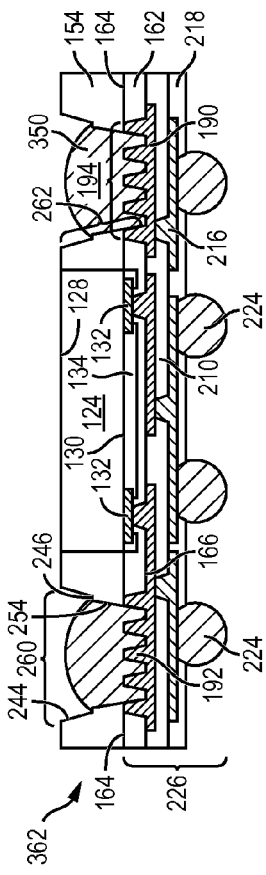

SEMICONDUCTOR DEVICE AND METHOD OF FORMING THROUGH MOLD HOLE WITH ALIGNMENT AND DIMENSION CONTROL

FIELD OF THE INVENTION

The present invention relates in general to semiconductor devices and, more particularly, to a semiconductor device and method of forming a three dimensional (3D) fan-out package.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

The manufacturing of smaller semiconductor devices relies on implementing improvements to horizontal and vertical electrical interconnection between multiple semiconductor devices on multiple levels (3D device integration). One approach to achieving the objectives of greater integration and smaller semiconductor devices is to focus on 3D packaging technologies including package-on-package (PoP) and fan-out wafer level chip scale packages (Fo-WLCSP). The electrical interconnection between a Fo-WLCSP containing semiconductor devices on multiple levels and external devices can be accomplished by forming redistribution layers (RDLs) within a build-up interconnect structure over both a front side and a backside of a semiconductor die within a Fo-WLCSP. However, the formation of multiple RDLs including over a front side and backside of a semiconductor die can be a slow and costly approach for making electrical interconnection for Fo-WLCSPs and can result in higher fabrication costs. Further, forming build-up interconnect structures over Fo-WLCSPs can also lead to warpage before and after removal of the carrier.

3D device integration can be also accomplished with conductive through silicon vias (TSV) or through hole vias (THV). THV may be formed as blind THV through a backside of a Fo-WLCSP to electrically connect to RDLs on a front side of a Fo-WLCSP. Alignment of blind THV with the underlying RDLs is difficult, because misalignment may not be detected until the THV are fully out of pattern with the RDLs. RDLs have a fine pitch between adjacent RDLs, and misalignment of THV over RDLs may not be detected. Misalignment of THVs with underlying RDLs causes defects and reduces reliability of the device.

SUMMARY OF THE INVENTION

A need exists for a simple and cost effective structure for through-mold-hole (TMH) alignment and dimension inspection within 3D semiconductor devices. Accordingly, in one embodiment, the present invention is a method of making a semiconductor device comprising the steps of providing a semiconductor die, depositing an encapsulant over a first surface of the semiconductor die and around the semiconductor die, forming a first insulating layer over a second surface of the semiconductor die opposite the first surface, forming a plurality of conductive vias through the first insulating layer, and forming a first opening in the encapsulant to expose the conductive vias.

In another embodiment, the present invention is a method of making a semiconductor device comprising the steps of providing a semiconductor die, depositing an encapsulant over the semiconductor die, forming a conductive via array over the encapsulant outside a footprint of the semiconductor die, and forming a first opening in the encapsulant to expose the conductive via array.

In another embodiment, the present invention is a semiconductor device comprising a semiconductor die and an encapsulant deposited over the semiconductor die. A first conductive via is formed over the encapsulant. An opening is formed through the encapsulant to expose the conductive via.

In another embodiment, the present invention is a semiconductor device comprising a semiconductor die and an encapsulant deposited around the semiconductor die. A conductive via array is formed over the encapsulant outside a footprint of the semiconductor die.

BRIEF DESCRIPTION OF THE DRAWINGS

FIG. 5 illustrates a 3D Fo-WLCSP with a via array for alignment and dimension control.

DETAILED DESCRIPTION OF THE DRAWINGS

Figure 1:
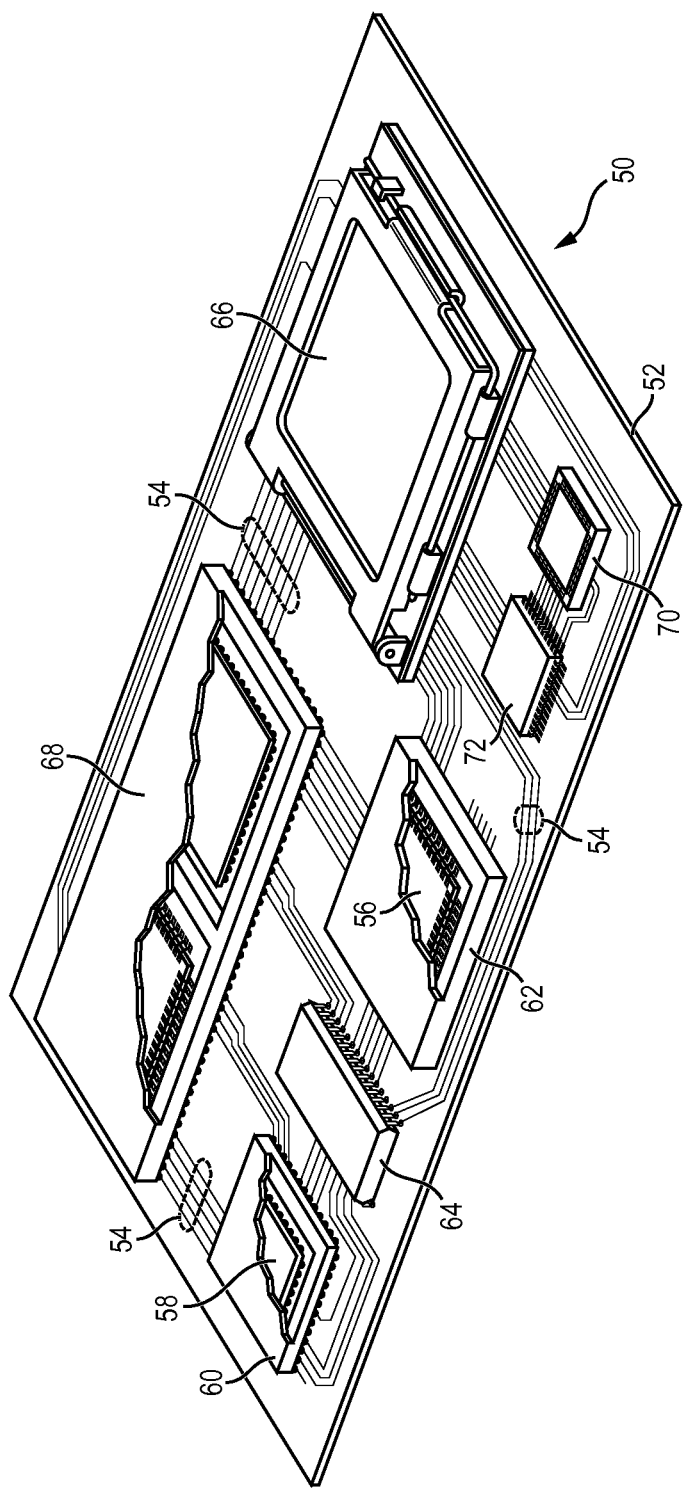
FIG. 1 illustrates a printed circuit board (PCB) with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices by dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

Back-end manufacturing refers to cutting or singulating the finished wafer into the individual semiconductor die and then packaging the semiconductor die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for the products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 2A:
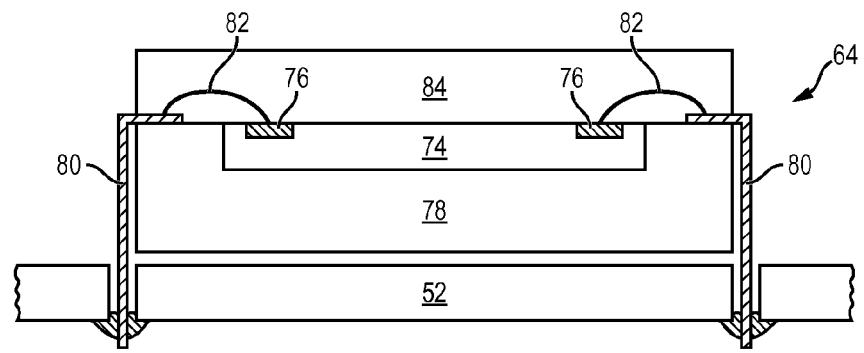
FIGS. 2a-2c illustrate further detail of the representative semiconductor packages mounted to the PCB.
Figure 2B:
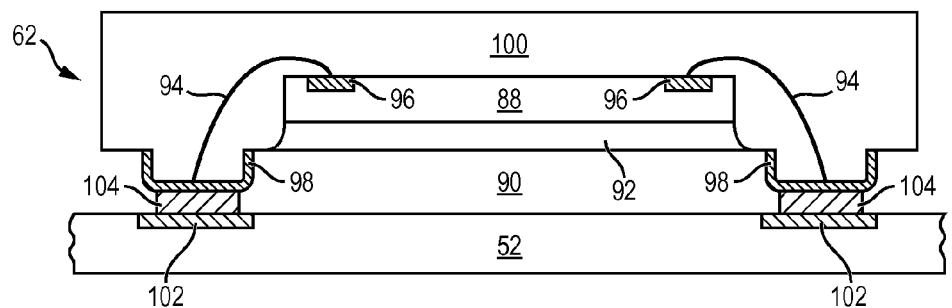
Figure 2C:
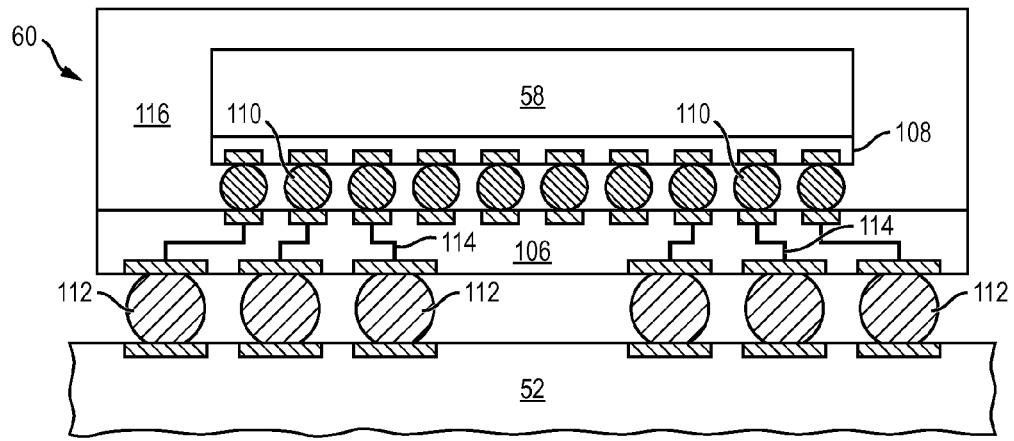

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating semiconductor die 74 or bond wires 82.

FIG. 2b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 3A:
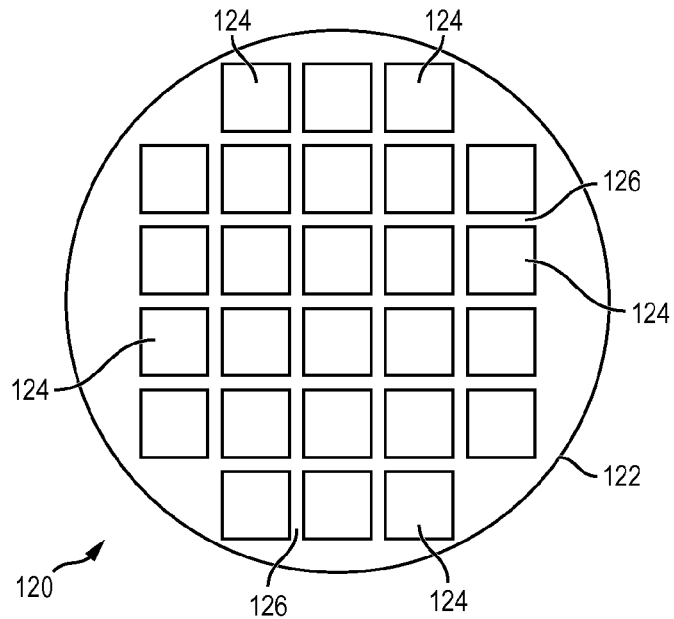
FIGS. 3a-3c illustrate a semiconductor wafer with a plurality of semiconductor die separated by a saw street.

FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124.

Figure 3B:
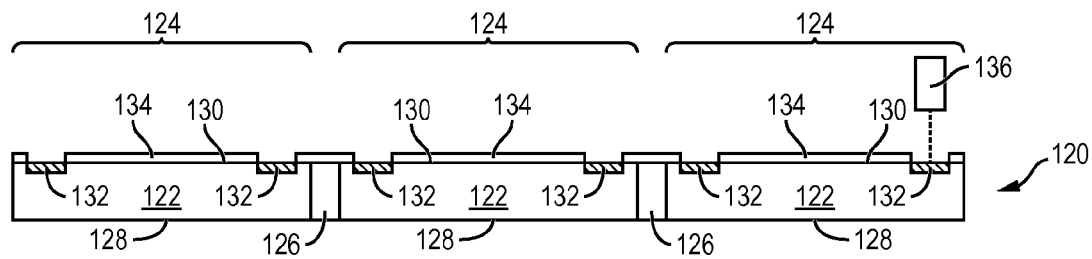

FIG. 3b shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing. In one embodiment, semiconductor die 124 is a flipchip type device.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130. Conductive layer 132 can be formed as contact pads disposed side-by-side a first distance from the edge of semiconductor die 124, as shown in FIG. 3b. Alternatively, conductive layer 132 can be formed as contact pads that are offset in multiple rows such that a first row of contact pads is disposed a first distance from the edge of the die, and a second row of contact pads alternating with the first row is disposed a second distance from the edge of the die.

An insulating or passivation layer 134 is formed over active surface 130 and conductive layer 132 using PVD, CVD, printing, spin coating, spray coating, sintering, or thermal oxidation. The insulating layer 134 contains one or more layers of silicon dioxide ($SiO_2$), silicon nitride ($Si_3N_4$), silicon oxynitride (SiON), tantalum pentoxide ($Ta_2O_5$), aluminum oxide ($Al_2O_3$), or other material having similar insulating and structural properties. The insulating layer 134 covers and provides protection for active surface 130. A portion of insulating layer 134 is removed by laser direct ablation (LDA) using laser 136 or an etching process through a patterned photoresist layer to expose conductive layer 132 and provide for subsequent electrical interconnect.

Figure 3C:
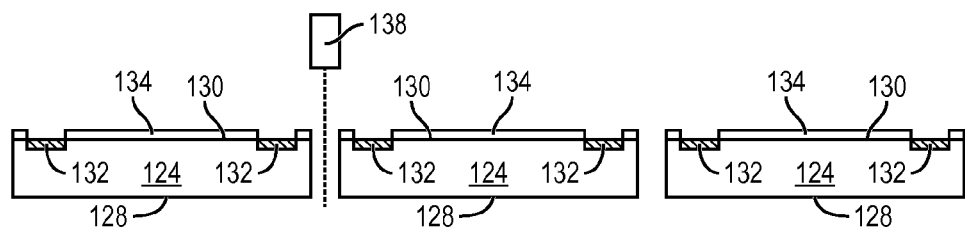

In FIG. 3c, semiconductor wafer 120 is singulated through saw street 126 using a saw blade or laser cutting tool 136 into individual semiconductor die 124.

FIGS. 4a-4z illustrate, in relation to FIGS. 1 and 2a-2c, a process of forming a Fo-WLCSP semiconductor device with a via array for alignment and dimension control. FIG. 4a shows a cross-sectional view of a portion of a carrier or temporary substrate 150 containing sacrificial base material such as silicon, polymer, beryllium oxide, glass, or other suitable low-cost, rigid material for structural support. Carrier 150 can be circular or rectangular according to the design or function of the semiconductor package. An interface layer or double-sided tape 152 is formed over carrier 150 as a temporary adhesive bonding film, etch-stop layer, or thermal release layer.

In FIG. 4b, semiconductor die 124 from FIG. 3c are mounted to interface layer 152 and over carrier 150 using, for example, a pick and place operation with active surface 130 oriented toward the carrier. Semiconductor die 124 are pressed into interface layer 152 such that a portion of insulating layer 134 or semiconductor die 124 is disposed within, and surrounded by, the interface layer.

In FIG. 4c, an encapsulant or molding compound 154 is deposited over semiconductor die 124, interface layer 152, and carrier 150 using a paste printing, compressive molding, transfer molding, liquid encapsulant molding, vacuum or pressure lamination with or without heat, spin coating, or other suitable applicator. Encapsulant 154 can be polymer composite material, such as epoxy resin with filler, epoxy acrylate with filler, or polymer with proper filler. Encapsulant 154 is non-conductive and environmentally protects the semiconductor device from external elements and contaminants.

FIG. 4c shows composite substrate or reconstituted wafer 156 covered by encapsulant 154. Encapsulant 154 is formed over back surface 128 of semiconductor die 124, and can be thinned in a subsequent backgrinding step. Encapsulant 154 can also be deposited such that the encapsulant is coplanar with back surface 128 and does not cover the back surface. In either case, encapsulant 154 facilitates the subsequent formation of a fan-out build-up interconnect structure over encapsulant 154 and semiconductor die 124.

Figure 4D:
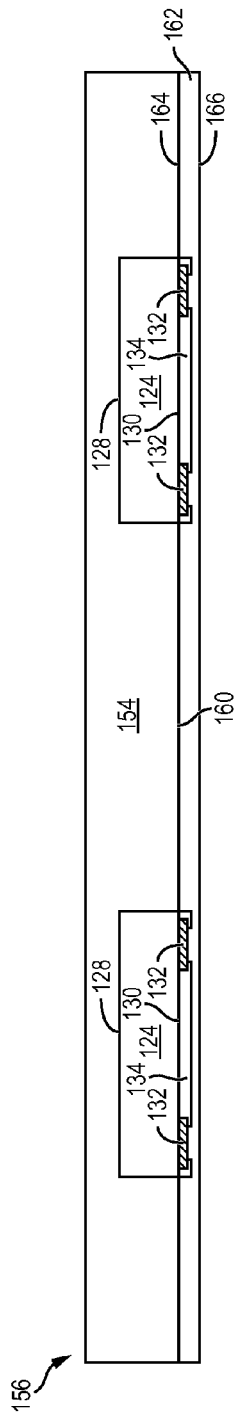
FIGS. 4a-4z illustrate a process of forming a 3D Fo-WLCSP with a via array for alignment and dimension control.

In FIG. 4d, carrier 150 and interface layer 152 are removed from reconstituted wafer 156 by chemical etching, mechanical peeling, chemical mechanical planarization (CMP), mechanical grinding, thermal bake, UV light, laser scanning, or wet stripping to facilitate the formation of an interconnect structure over active surface 130 of semiconductor die 124 and surface 160 of encapsulant 154.

FIG. 4d also shows a first portion of a fan-out build-up interconnect structure or RDL is formed by the deposition and patterning of insulating or passivation layer 162. Insulating layer 162 is conformally applied to, and has a first surface 164 that follows the contours of, surface 160 of encapsulant 154, insulating layer 134, semiconductor die 124, and conductive layer 132. Insulating layer 162 has a second planar surface 166 opposite first surface 164. Insulating layer 162 contains one or more layers of SiO2, Si3N4, SiON, Ta2O5, Al2O3, or other material having similar insulating and structural properties. Insulating layer 162 is deposited using PVD, CVD, printing, spin coating, spray coating, sintering, thermal oxidation, or other suitable process.

Figure 4E:
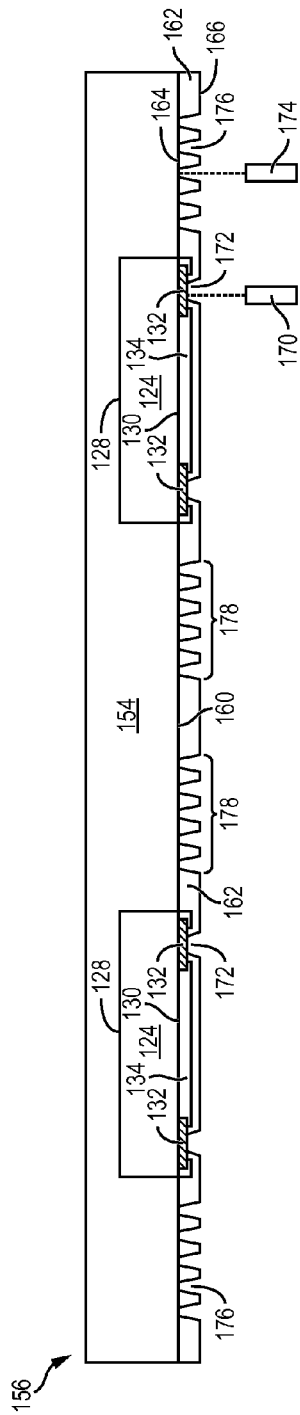

In FIG. 4e, a portion of insulating layer 162 is removed by an exposure or development process, LDA with laser 170, etching, or other suitable process to form openings 172 to expose conductive pads 132. Openings 172 extend completely through insulating layer 162 over conductive pads 132. Additionally, a portion of insulating layer 162 outside a footprint of semiconductor die 124 is removed by an exposure or development process, LDA using laser 174, etching, or other suitable process to create micro vias or openings 176. Micro vias 176 extend completely through insulating layer 162 from second planar surface 166 to first surface 164 of insulating layer 162.

Micro vias 176 can have a straight, sloped, stepped, or tapered sidewall. In one embodiment, micro vias 176 have a cross-sectional width or diameter ranging from 10-100 micrometers (μm). In another embodiment, micro vias 176 have a cross-sectional width or diameter ranging from 20-30 μm. A plurality of micro vias 176 is formed outside a footprint of semiconductor die 124 and in a peripheral region or area of semiconductor die 124 in an array or group of micro vias 176 to form a micro via array 178. Micro via array 178 contains one or more micro vias 176. Micro via array 178 extends completely through insulating layer 162 and exposes surface 160 of encapsulant 154 outside a footprint of semiconductor die 124.

Figure 4F:
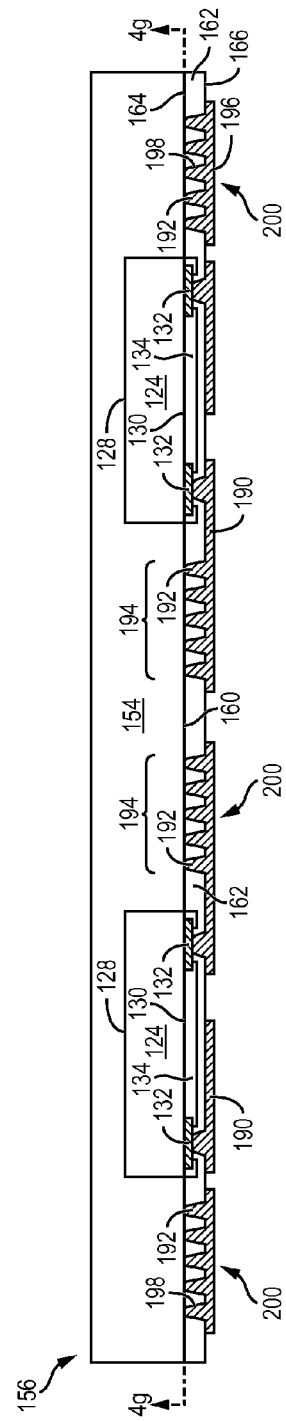

In FIG. 4f, an electrically conductive layer 190 is formed over insulating layer 162, encapsulant 154, and semiconductor die 124 using a patterning and metal deposition process, such as PVD, CVD, electrolytic plating, or electroless plating process. Conductive layer 190 can be one or more layers of Al, Cu, Sn, Ni, Au, Ag, or other suitable electrically conductive material. Individual portions of conductive layer 190 can be electrically common or electrically isolated according to the design and function of semiconductor die 124. A portion of conductive layer 190 extends through openings 172 to electrically connect conductive layer 190 to conductive layer 132. A portion of conductive layer 190 extends horizontally along insulating layer 162 and parallel to active surface 130 of semiconductor die 124 to laterally redistribute the electrical interconnect to conductive layer 132 of semiconductor die 124. Conductive layer 190 operates as a fan-out RDL, providing lateral or horizontal redistribution for the electrical signals of semiconductor die 124.

A portion of conductive layer 190 also extends through micro vias 176 to form conductive micro vias 192. Conductive micro vias 192 extend from the horizontal portion of conductive layer 190, through insulating layer 162, to surface 160 of encapsulant 154. Conductive micro vias 192 can have straight, sloped, tapered, or stepped sidewalls. In one embodiment, conductive micro vias 192 have a generally conical shape with a generally circular cross-section. In another embodiment, conductive micro vias 192 have a generally cylindrical shape with a generally circular cross-section. In another embodiment, conductive micro vias 192 have a generally cubic shape with a generally rectangular cross-section. The shape of conductive micro vias 192 can vary according to the design and function of semiconductor die 124. In one embodiment, conductive micro vias 192 have a cross-sectional width or diameter ranging from 10-100 μm. In another embodiment, conductive micro vias 192 have a cross-sectional width or diameter ranging from 20-30 μm.

Conductive micro vias 192 are formed in a peripheral region or area of semiconductor die 124, outside a footprint of semiconductor die 124, as a group or array of multiple conductive micro vias 192 to form a conductive micro via array 194. Conductive micro vias 192, within conductive micro via array 194, form a series of peaks and valleys of conductive layer 190, which assists with alignment during subsequent TMH formation.

Conductive layer 190 further includes planar surface 196 at a surface opposite encapsulant 154. Insulating layer 162 with micro via array 178 provides a surface over which conductive layer 190 can be planarized. Surface 196 of conductive layer 190 is substantially planarized by nature of conductive layer 190 being formed over micro via array 178. Conductive layer 190 which is formed within micro vias 176 and over insulating layer 162 forms a non-planar surface 198 opposite planar surface 196. Conductive layer 190 including conductive micro vias 192 and planar surface 196 together form a conductive pad 200 disposed over encapsulant 154 outside a footprint of semiconductor die 124.

Figure 4G:
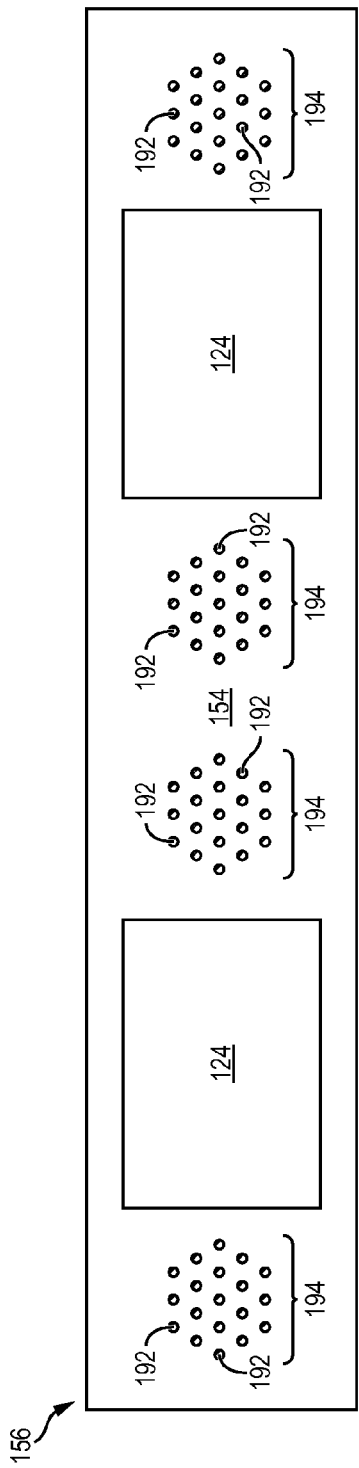

FIG. 4g shows a plan view of the assembly from FIG. 4f, from a plane that runs parallel to active surface 130 of semiconductor die 124 and the horizontal portion of conductive layer 190, along surface 166 of insulating layer 162, and surface 160 of encapsulant 154. A plurality of conductive micro vias 192 is formed outside a footprint of semiconductor die 124 and extends through insulating layer 162 to encapsulant 154. In one embodiment, conductive micro vias 192 are staggered. In another embodiment, conductive micro vias 192 are formed in a generally circular or hexagonal shape or pattern around a central conductive micro via 192. Collectively, conductive micro vias 192 constitute conductive micro via array 194. In one embodiment, conductive micro via array 194 has fewer or additional conductive micro vias 192, according to alignment and dimension requirements for subsequently formed TMH. In another embodiment, conductive micro vias 192 are arranged in different patterns or arrangements within conductive micro via array 194, for example, columns or rows of multiple conductive micro vias 192.

Figure 4H:
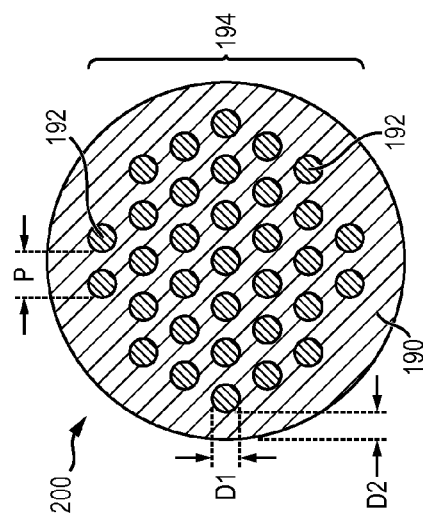

FIG. 4h shows a plan view of a conductive pad including conductive micro vias. Conductive pad 200 includes conductive micro via array 194 formed from a plurality of micro vias 192 extending from conductive layer 190. In one embodiment, conductive pad 200 has a diameter ranging from 280-330 μm. In one embodiment, conductive micro vias 192 are positioned around a central conductive micro via 192, with each conductive micro via 192 disposed an equal distance from adjacent conductive micro vias 192. In one embodiment, a pitch P of conductive micro vias 192 is 40 μm and a diameter D1 of conductive micro vias 192 is 20 μm. In another embodiment, conductive micro via array 194 has an overall width or diameter ranging from 180-270 μm. Conductive micro via array 194 is formed over conductive pad 200 a distance D2 from the edge of conductive pad 200. In one embodiment, the distance D2 from a peripheral conductive micro via 192 to the edge of conductive pad 200 ranges from 5-40 μm.

In FIG. 4i, an insulating or passivation layer 210 is conformally applied to, and follows the contours of, insulating layer 162 and conductive layer 190. Insulating layer 210 contains one or more layers of Si02, Si3N4, SiON, Ta2O5, Al2O3, or other material having similar insulating and structural properties. Insulating layer 210 is deposited using PVD, CVD, printing, spin coating, spray coating, sintering, thermal oxidation, or other suitable process. Planar surface 196 of conductive layer 190 provides a smooth or planar surface over which insulating layer 210 is formed. Because conductive layer 190 has planar surface 196, insulating layer 210 can be thinner than if the surface of conductive layer 190 was non-planar. A portion of insulating layer 210 is removed by an exposure or development process, LDA using laser 212, etching, or other suitable process to form openings 214 in insulating layer 210, which expose portions of conductive layer 190 for subsequent electrical interconnection.

In FIG. 4j, an electrically conductive layer 216 is formed over insulating layer 210 and conductive layer 190 using patterning with PVD, CVD, sputtering, electrolytic plating, electroless plating process, or other suitable metal deposition process. Conductive layer 216 can be one or more layers of Al, Cu, Sn, Ni, Au, Ag, or other suitable electrically conductive material. Conductive layer 216 is electrically connected to conductive layer 190. A portion of conductive layer 216 extends horizontally along insulating layer 210 and parallel to active surface 130 of semiconductor die 124 to laterally redistribute the electrical interconnect to conductive layer 190. Conductive layer 216 operates as a fan-out RDL for the electrical signals of semiconductor die 124. Other portions of conductive layer 216 are electrically common or electrically isolated depending on the connectivity of semiconductor die 124.

An insulating or passivation layer 218 is formed over insulating layer 210 and conductive layer 216 using PVD, CVD, printing, spin coating, spray coating, screen printing or lamination. Insulating layer 218 contains one or more layers of photosensitive polymer dielectric film with or without fillers, non-photosensitive polymer dielectric film, SiO2, Si3N4, SiON, Ta2O5, Al2O3, or other material having similar insulating and structural properties. A portion of insulating layer 218 is removed by an exposure or development process, LDA using laser 220, etching, or other suitable process to form openings 222 in insulating layer 218 to expose conductive layer 216. The thickness and material of insulating layer 218 can vary according to the design and function of semiconductor die 124. The thickness of insulating layer 218 can be less than or equal to the thickness of insulating layer 162. Alternatively, the thickness of insulating layer 218 can be greater than the thickness of insulating layer 162 to provide additional structural support, balance, stress relief, and warpage control to the package.

Figure 4K:
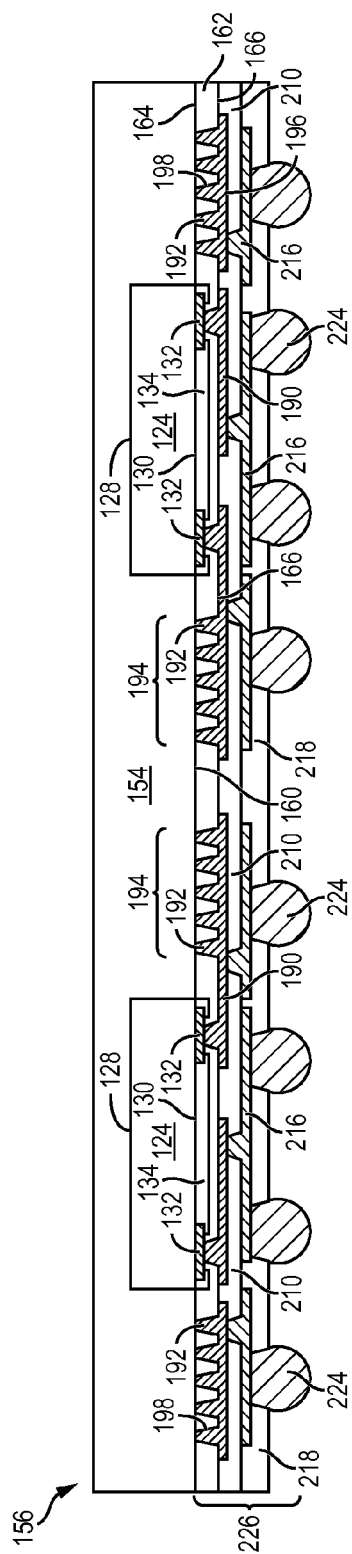

In FIG. 4k, an electrically conductive bump material is deposited over the exposed conductive layer 216 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 216 using a suitable attachment or bonding process. In one embodiment, the bump material is reflowed by heating the material above its melting point to form balls or bumps 224. In some applications, bumps 224 are reflowed a second time to improve electrical contact to conductive layer 216. An under bump metallization (UBM) layer can be formed under bumps 224. Bumps 224 can also be compression bonded to conductive layer 216. Bumps 224 represent one type of conductive interconnect structure that can be formed over conductive layer 216. The interconnect structure can also use stud bump, micro bump, or other electrical interconnect.

Collectively, insulating layers 162, 210, and 218, conductive layers 190 and 216, and bumps 224 constitute a build-up interconnect structure 226 formed over semiconductor die 124 and encapsulant 154 with conductive micro via array 194 formed outside a footprint of semiconductor die 124. Additional insulating layers and RDLs can be formed over insulating layer 218 prior to forming bumps 224, to provide additional vertical and horizontal electrical connectivity across the package according to the design and functionality of semiconductor die 124.

Figure 4L:
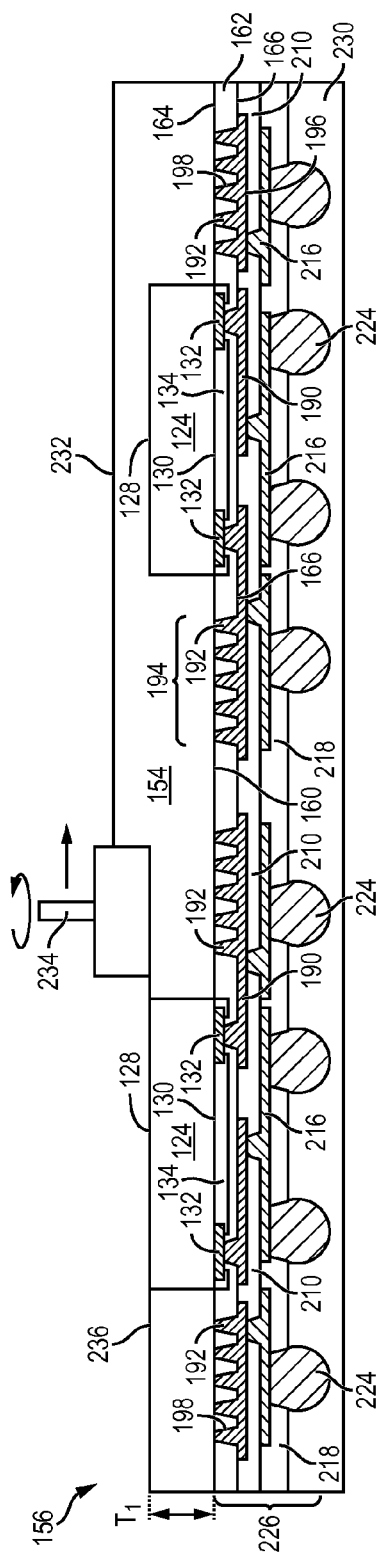

In FIG. 4l, a back grinding tape 230 is applied over build-up interconnect structure 226. Back grinding tape 230 contacts insulating layer 218 and bumps 224. Back grinding tape 230 follows the contours of a surface of bumps 224 and extends around and between bumps 224. Back grinding tape 230 includes tapes with thermal resistance up to 270° C. Back grinding tape 230 also includes tapes with a thermal release function. Examples of back grinding tape 230 include UV tape HT 440 and non-UV tape MY-595. Back grinding tape 230 provides structural support for a subsequent grinding operation and removal of a portion of encapsulant 154 from a backside surface 232 of encapsulant 154, opposite build-up interconnect structure 226.

A backside surface 232 of encapsulant 154 undergoes a grinding operation with grinder 234 to planarize and reduce a thickness of encapsulant 154. A chemical etch can also be used to remove and planarize encapsulant 154 and to form planar backside surface 236. After the grinding operation is completed, back surface 128 of semiconductor die 124 is exposed. A thickness of semiconductor die 124 can also be reduced by the grinding operation. Alternatively, a thickness of encapsulant 154 maintains coverage over back surface 128 of semiconductor die 124. Back grinding tape 230 can be actively cooled during the grinding operation.

Figure 4M:
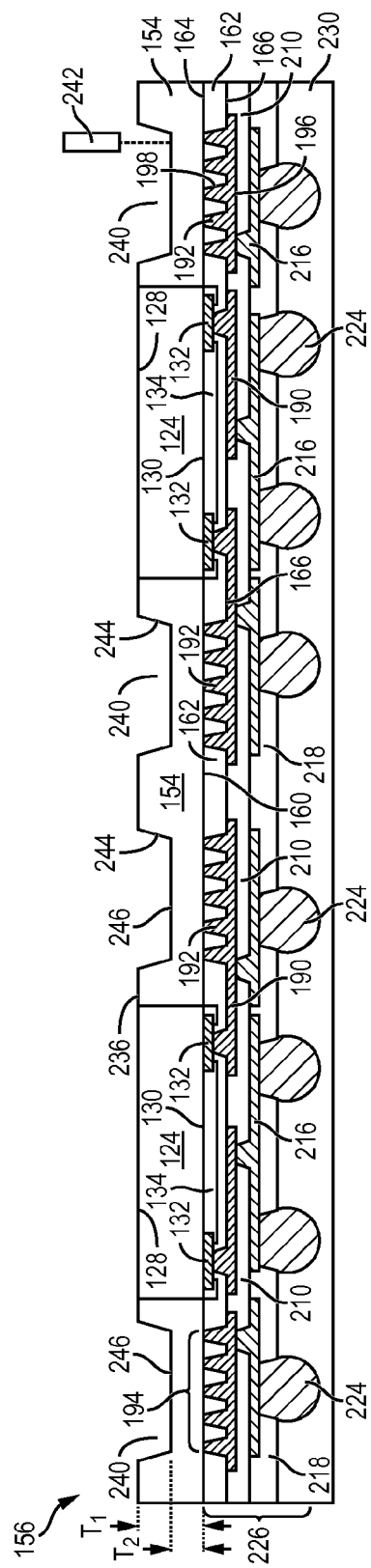

In FIG. 4m, a portion of encapsulant 154 is removed in a peripheral region of semiconductor die 124, over conductive micro via array 194, to form openings 240. Openings 240 are formed by drilling, high energy water jetting, an etching process with a patterned photoresist layer, or other suitable process. Alternatively, a portion of encapsulant 154 is removed in a peripheral region of semiconductor die 124 over conductive micro via array 194 by LDA using laser 242 to form openings 240. Openings 240 have a vertical or sloped sidewall 244 and extend from backside surface 236 of encapsulant 154, partially through encapsulant 154, to a recessed surface 246 of encapsulant 154. Openings 240 constitute a TMH extending partially through encapsulant 154. In one embodiment, openings 240 have a cross-sectional width ranging from 180-450 μm. After forming openings 240, encapsulant 154 has a thickness T2, smaller than thickness T1, measured from surface 160 of encapsulant 154 to recessed surface 246 of encapsulant 154, within a footprint of openings 240. In one embodiment, thickness T2 of encapsulant 154 is between 20-50 μm.

Figure 4N:
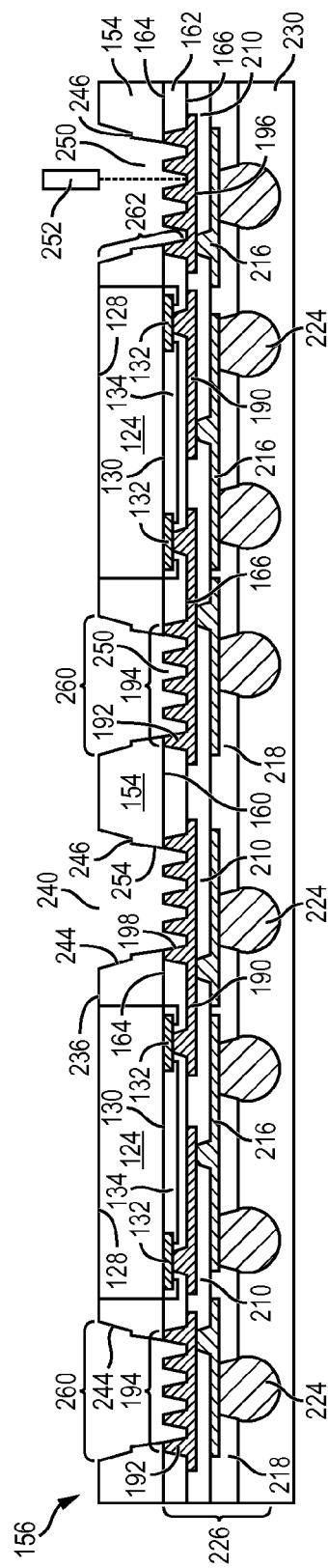

In FIG. 4n, a portion of encapsulant 154 and insulating layer 162 is removed within a footprint of openings 240, in a peripheral region of semiconductor die 124, and over conductive micro via array 194, to form openings 250 and to expose conductive layer 190 and conductive micro via array 194. Openings 250 are formed by drilling, high energy water jetting, an etching process with a patterned photoresist layer, or other suitable process. Alternatively, a portion of encapsulant 154 is removed within a footprint of openings 240, in a peripheral region of semiconductor die 124, and over conductive micro via array 194 by LDA using laser 252 to form openings 250. Openings 250 include a vertical or sloped sidewall 254 extending through encapsulant 154 and insulating layer 162, from recessed surface 246 to conductive layer 190. Openings 250 constitute a TMH and extend from recessed surface 246 of encapsulant 154, through insulating layer 162, to conductive micro via array 194. Openings 250 have a cross-sectional width less than the cross-sectional width of openings 240. In one embodiment, openings 250 have a cross-sectional width ranging from 180-270 μm.

Collectively, openings 240 and 250 constitute openings 260. Openings 260 have a stepped sidewall 262, resulting from the process of forming openings 250 with a smaller cross-sectional width than openings 240. Openings 260 have a first diameter or cross-sectional width within openings 250, ranging from 180-270 μm, and a second diameter or cross-sectional width within openings 240, ranging from 180-450 μm. Thus, openings 260 constitute a TMH with a step-through-hole structure. The step-through-hole structure increases structural support and reduces damage to the package, including build-up interconnect structure 226, during processing, for example, during a desmearing process, solder capping, or a package-on-package stack soldering process.

The assembly may be actively cooled during the formation of openings 260 to avoid stripping back grinding tape 230, and to minimize the thermal impact on semiconductor die 124. In another embodiment, the assembly is not actively cooled during the formation of openings 260, but the laser source or drilling sequence parameters is optimized to minimize thermal impact on semiconductor die 124.

The process of forming openings 260 further includes removing a portion of insulating layer 162 covering conductive micro via array 194. Thus, openings 260 expose conductive micro via array 194 and conductive micro vias 192 of conductive layer 190 through encapsulant 154. The exposed conductive micro via array 194 can be used to determine proper alignment of openings 260. Conductive micro via array 194 can also be used to measure the dimension of openings 260. Conductive micro via array 194 also provides a greater exposed surface area for conductive layer 190 than if the exposed portion of conductive layer 190 were flat or planar. Conductive micro via array 194 thereby provides greater contact surface area between conductive layer 190 and subsequently deposited conductive bump material, for improved and more robust electrical and mechanical contact between subsequently deposited conductive bump material and conductive layer 190.

FIG. 4o shows a top or plan view of the assembly from FIG. 4n. Openings 260 are formed in a peripheral region of semiconductor die 124 and extend from an exposed backside surface 236 of encapsulant 154, through encapsulant 154 and insulating layer 162, to conductive layer 190. Openings 260 constitute a TMH with a step-through-hole structure. Openings 260 expose conductive layer 190, with conductive micro vias 192 forming conductive micro via array 194. Conductive micro vias 192 form a series of peaks and valleys of conductive layer 190 which assists with alignment and dimension inspection during TMH formation. Conductive micro via array 194 also provides a greater exposed surface area of conductive layer 190 than if the exposed portion of conductive layer 190 were flat or planar. Therefore, conductive micro via array 194 facilitates an improved and more reliable mechanical and electrical connection between conductive layer 190 and subsequently deposited bump material.

FIG. 4p shows a plan view of a conductive pad with via array for alignment and dimension checking. Conductive pad 200 includes conductive micro via array 194. In one embodiment, conductive pad 200 has a diameter of 280-330 μm. Opening 260 exposes conductive micro via array 194 through encapsulant 154. In one embodiment, opening 260 has a diameter of 180-270 μm over conductive pad 200. Conductive micro via array 194 includes conductive micro vias 192 positioned for the inspection of the dimension of openings 260. In one embodiment, conductive micro vias 192 are staggered. Conductive micro vias 192 are formed with a predetermined size and pitch, which is used for measuring the size of openings 260. In one embodiment, conductive micro vias 192 include a diameter of 20 μm and a pitch of 40 μm. After openings 260 are formed through encapsulant 154 and conductive micro vias 192 are exposed, the size of openings 260 can be measured by inspecting the number of exposed conductive micro vias 192. Because conductive micro vias 192 have a predetermined diameter and pitch, the size of openings 260 can be determined by visual inspection of the exposed conductive micro vias 192.

Conductive micro via array 194 includes conductive micro vias 192 formed in a pattern on conductive pad 200. The pattern of conductive micro via array 194 is used to determine alignment of openings 260 over conductive pad 200. Openings 260 fully or partially expose conductive micro via array 194. If openings 260 are misaligned over conductive pad 200, the position of conductive micro via array 194 is off center with respect to openings 260. Misalignment of openings 260 can easily be detected by inspecting the exposed conductive micro vias 192 to determine the position of openings 260 over conductive pad 200. In one embodiment, conductive micro vias 192 are positioned 5-40 µm from an edge of conductive pad 200. Conductive micro via array 194 can also be used for set up and alignment of laser 252, which is used to form openings 260. For example, a first opening 260 is formed, and the position of conductive micro via array 194 within opening 260 is determined. The position of laser 252 can be adjusted to correct misalignment identified with the first opening 260 prior to forming subsequent openings 260. Specific conductive micro vias 192 of conductive micro via array 194 can be used during laser set up to spatially register the laser prior to forming additional openings 260 in reconstituted wafer 156. Therefore, the alignment of openings 260 over conductive pad 200 is improved with conductive micro via array 194.

FIG. 4q shows a plan view of an alternative embodiment of a conductive pad with a conductive micro via array. Conductive pad 270 is formed by the process shown in FIGS. 4a-4o and includes conductive micro via array 272. Conductive micro vias 192a-192b constitute conductive micro via array 272. In conductive micro via array 272, conductive micro vias 192a-192b are positioned for inspection of the alignment and dimensions of openings 260. Conductive micro vias 192a-192b are formed in a generally circular or hexagonal shape or pattern around a central conductive micro via 192a. Conductive micro vias 192a-192b are formed with a predetermined size and pitch, which is used for measuring the size of openings 260. In one embodiment, conductive micro vias 192a-192b include a diameter of 20 µm and a pitch of 40 µm. After openings 260 are formed through encapsulant 154 and conductive micro vias 192a-192b are exposed, the size of openings 260 can be measured by inspecting the number of exposed conductive micro vias 192a-192b. Because conductive micro vias 192a-192b have a predetermined diameter and pitch, the size of openings 260 can be determined by visual inspection of the exposed conductive micro vias 192a-192b. In one embodiment, conductive pad 270 has a diameter of 280-330 µm and opening 260 has a diameter of 180-270 µm.

Conductive micro via array 272 includes conductive micro vias 192a positioned within conductive micro via array 272 for alignment and spatial registration of laser 252. Conductive micro vias 192a are disposed in a star-shaped pattern among conductive micro vias 192b. The location of conductive micro vias 192a is used to position laser 252 during set up. For example, a first opening 260 is formed. Opening 260 exposes conductive micro via array 272 through encapsulant 154. The position of conductive micro via array 272 within opening 260 is determined. The position of laser 252 can be adjusted to correct misalignment identified with the first opening 260 prior to forming subsequent openings 260. Additional openings 260 are formed in reconstituted wafer 156 after adjustment of laser 252. Therefore, the alignment of openings 260 over conductive pad 270 is improved with conductive micro via array 272.

FIG. 4r shows a plan view of another embodiment of a conductive pad with a conductive micro via array. Conductive pad 280 is formed by the process shown in FIGS. 4a-4o and includes conductive micro via array 282. Conductive micro vias 192a-192b constitute conductive micro via array 282. Conductive micro vias 192a-192b are positioned in a generally circular or hexagonal shape or pattern around a central conductive micro via 192a and are used for inspection of the alignment and dimensions of openings 260. After openings 260 are formed through encapsulant 154 and conductive micro vias 192a-192b are exposed, the size of openings 260 can be determined by inspecting the number of exposed conductive micro vias 192a-192b.

Conductive micro via array 272 includes conductive micro vias 192a positioned within conductive micro via array 272 for alignment and spatial registration of laser 252. Conductive micro vias 192a are disposed in a hexagonal pattern among conductive micro vias 192b. Conductive micro vias 192a are used during laser set up to spatially register the laser prior to forming additional openings 260 in reconstituted wafer 156. Therefore, the alignment of openings 260 over conductive pad 280 is improved with conductive micro via array 282.

FIG. 4s shows a plan view of another embodiment of a conductive pad with a conductive micro via array. Conductive pad 290 is formed by the process shown in FIGS. 4a-4o and includes conductive micro via array 292. Conductive micro vias 192a-192b constitute conductive micro via array 292. Conductive micro vias 192a-192b are positioned in a generally circular or hexagonal shape or pattern around a central conductive micro via 192a and are used for inspection of the alignment and dimensions of openings 260. After openings 260 are formed through encapsulant 154 and conductive micro vias 192a-192b are exposed, the size of openings 260 can be determined by inspecting the number of exposed conductive micro vias 192a-192b.

Conductive micro via array 292 includes conductive micro vias 192a positioned within conductive micro via array 292 for alignment and spatial registration of laser 252. Conductive micro vias 192a are disposed in staggered rows or columns among conductive micro vias 192b. Conductive micro vias 192a are used during laser set up to spatially register the laser prior to forming additional openings 260 in reconstituted wafer 156. Therefore, the alignment of openings 260 over conductive pad 290 is improved with conductive micro via array 292.

FIG. 4t shows a plan view of another embodiment of a conductive pad with a conductive micro via array. Conductive pad 300 is formed by the process shown in FIGS. 4a-4o and includes conductive micro via array 302. Conductive micro vias 192a-192b constitute conductive micro via array 302. Conductive micro vias 192a-192b are positioned in a generally circular or hexagonal shape or pattern around a central conductive micro via 192a and are used for inspection of the alignment and dimensions of openings 260. After openings 260 are formed through encapsulant 154 and conductive micro vias 192a-192b are exposed, the size of openings 260 can be determined by inspecting the number of exposed conductive micro vias 192a-192b.

Conductive micro via array 302 includes conductive micro vias 192a positioned within conductive micro via array 302 for alignment and spatial registration of laser 252. Conductive micro vias 192a are disposed in staggered rows or columns among conductive micro vias 192b. Conductive micro vias 192a are used during laser set up to spatially register the laser prior to forming additional openings 260 in reconstituted wafer 156. Therefore, the alignment of openings 260 over conductive pad 300 is improved with conductive micro via array 302.

FIG. 4u shows a plan view of another embodiment of a conductive pad with a conductive micro via array. Conductive pad 310 is formed by the process shown in FIGS. 4a-4o and includes conductive micro via array 312. Conductive micro vias 192a-192b constitute conductive micro via array 312. Conductive micro vias 192a-192b are positioned in a generally circular or hexagonal shape or pattern around a central conductive micro via 192a and are used for inspection of the alignment and dimensions of openings 260. After openings 260 are formed through encapsulant 154 and conductive micro vias 192a-192b are exposed, the size of openings 260 can be determined by inspecting the number of exposed conductive micro vias 192a-192b.

Conductive micro via array 312 includes conductive micro vias 192a positioned within conductive micro via array 312 for alignment and spatial registration of laser 252. Conductive micro vias 192a are disposed in a hexagonal pattern among conductive micro vias 192b. Conductive micro vias 192a are used during laser set up to spatially register the laser prior to forming additional openings 260 in reconstituted wafer 156. Therefore, the alignment of openings 260 over conductive pad 310 is improved with conductive micro via array 312.

FIG. 4v shows a plan view of another embodiment of a conductive pad with a conductive micro via array. Conductive pad 320 is formed by the process shown in FIGS. 4a-4o and includes conductive micro via array 322. Conductive micro vias 192a-192b constitute conductive micro via array 322. Conductive micro vias 192a-192b are positioned in a generally circular or hexagonal shape or pattern around a central conductive micro via 192a and are used for inspection of the alignment and dimensions of openings 260. After openings 260 are formed through encapsulant 154, a portion of conductive micro vias 192a-192b is exposed. A portion of conductive micro vias 192a are disposed along an edge of conductive pad 320. In one embodiment, conductive micro vias 192a-192b are positioned 5-40 µm from an edge of conductive pad 320. The conductive micro vias 192a disposed along an edge of conductive pad 320 are not exposed by openings 260 and remain covered by encapsulant 154. In one embodiment, conductive pad 320 has a diameter of 280-330 µm and openings 260 have a diameter of 180-270 µm. The size of openings 260 can be determined by inspecting the number of exposed conductive micro vias 192a-192b.

Conductive micro via array 322 includes conductive micro vias 192a positioned within conductive micro via array 322 for alignment and spatial registration of laser 252. Conductive micro vias 192a are disposed in a hexagonal pattern among conductive micro vias 192b. Conductive micro vias 192a are used during laser set up to spatially register the laser prior to forming additional openings 260 in reconstituted wafer 156. Therefore, the alignment of openings 260 over conductive pad 320 is improved with conductive micro via array 322.

FIG. 4w shows a plan view of another embodiment of a conductive pad with a conductive micro via array. Conductive pad 330 is formed by the process shown in FIGS. 4a-4o and includes conductive micro via array 332. After openings 260 are formed through encapsulant 154, a portion of conductive micro vias 192 is exposed. A portion of conductive micro vias 192 is disposed along an edge of conductive pad 330. In one embodiment, conductive micro vias 192 are positioned 5-40 µm from an edge of conductive pad 330. The conductive micro vias 192 disposed along an edge of conductive pad 330 are not exposed by openings 260 and remain covered by encapsulant 154. In one embodiment, conductive pad 330 has a diameter of 280-330 µm and openings 260 have a diameter of 180-270 µm. The size of openings 260 can be determined by inspecting the number of exposed conductive micro vias 192.

Conductive micro via array 332 includes conductive micro vias 192a positioned within conductive micro via array 332 for alignment and spatial registration of laser 252. Conductive micro vias 192 are disposed in staggered rows or columns. Conductive micro vias 192 are used during laser set up to spatially register the laser prior to forming additional openings 260 in reconstituted wafer 156. Therefore, the alignment of openings 260 over conductive pad 330 is improved with conductive micro via array 332.

FIG. 4x shows a plan view of another embodiment of a conductive pad with a conductive micro via array. Conductive pad 340 is formed by the process shown in FIGS. 4a-4o and includes conductive micro via array 342. Conductive micro vias 192 are positioned in a generally circular or hexagonal shape or pattern around a central conductive micro via 192a and are used for inspection of the alignment and dimensions of openings 260. Conductive micro vias 192 have a circular or a rectangular shape. Conductive micro vias 192 disposed along an edge of conductive pad 340 are rectangular shaped have a length L1 and a width W1. In one embodiment, conductive micro vias 192 have a length L1 of 20-70 µm and a width W1 of approximately 20 µm. Conductive micro vias 192 disposed in a central region of conductive pad 340 have a circular shape. In one embodiment, conductive micro vias 192 include a diameter of 20 µm and a pitch of 40 µm. After openings 260 are formed through encapsulant 154 and conductive micro vias 192 are exposed, the size of openings 260 can be determined by inspecting the number of exposed conductive micro vias 192.

The pattern of conductive micro via array 342 is used to determine alignment of openings 260 over conductive pad 340. Openings 260 partially expose conductive micro via array 342. If openings 260 are misaligned over conductive pad 340, the position of conductive micro via array 342 is off center with respect to openings 260. Misalignment of openings 260 can easily be detected by inspecting the exposed conductive micro vias 192 to determine the position of openings 260 over conductive pad 340. Conductive micro via array 342 can also be used for set up and alignment of laser 252, which is used to form openings 260. For example, a first opening 260 is formed, and the position of conductive micro via array 342 within opening 260 is determined. The position of laser 252 can be adjusted to correct misalignment identified with the first opening 260 prior to forming subsequent openings 260. Specific conductive micro vias 192 of conductive micro via array 342 can be used during laser set up to spatially register the laser prior to forming additional openings 260 in reconstituted wafer 156. Therefore, the alignment of openings 260 over conductive pad 340 is improved with conductive micro via array 342.

FIG. 4y continues from FIG. 4o and shows an electrically conductive bump material deposited over the exposed conductive layer 190 and conductive micro vias 192 using an evaporation, electrolytic plating, electroless plating, ball drop, screen printing, jetting, or other suitable process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 190 using a suitable attachment or bonding process. In one embodiment, the bump material is reflowed by heating the material above its melting point to form spherical balls or bumps 350. In some applications, bumps 350 are reflowed a second time to improve electrical contact to conductive layer 190. A UBM layer can be formed under bumps 350. The bumps can also be compression bonded to conductive layer 190.

Bumps 350 represent one type of conductive interconnect structure that can be formed over conductive layer 190. The conductive interconnect structure can also use bond wires, Cu, Ag, or other conductive paste, stud bump, micro bump, solder balls with a Cu core, Cu balls or columns with dipped solder paste or solder coating, or other electrical interconnect. Bumps 350 are formed over conductive layer 190 and over and between conductive micro vias 192 of conductive micro via array 194. Accordingly, a 3D interconnection for next level interconnection is formed through bumps 350, conductive layer 190, conductive micro vias 192, build-up interconnect structure 226, and semiconductor die 124. The 3D interconnection provides vertical electrical interconnection for semiconductor die 124 without a backside interconnect or RDL over a footprint of semiconductor die 124. Conductive micro vias 192 provide better alignment and an increased contact surface area between conductive layer 190 and bumps 350 for improved and more robust mechanical and electrical connection between conductive layer 190 and bumps 350.

Back grinding tape 230 is removed after forming bumps 350. Alternatively, back grinding tape 230 is removed after completing the grinding operation of encapsulant 154, but before forming openings 260, and a supporting tape with high thermal conductivity and high heat resistance is applied over insulating layer 218 and bumps 224. Reconstituted wafer 156 can also be placed in a supporting jig, with a compliant top layer to avoid structural damage, prior to forming openings 260. The supporting jig has high thermal conductivity and an array of small vacuum holes to provide thermal protection and structural support for reconstituted wafer 156 during the formation of openings 260.

In FIG. 4z, the assembly from FIG. 4y is singulated through encapsulant 154, and insulating layers 162, 210, and 218 with saw blade or laser cutting tool 360 into individual Fo-WLCSPs 362.

FIG. 5 shows Fo-WLCSP 362 after singulation. Fo-WLCSP 362 provides 3D electrical interconnection with a fan-out RDL and conductive micro via array 194 formed outside a footprint of a semiconductor die 124. An encapsulant 154 is deposited over semiconductor die 124. An insulating layer 162 is formed over active surface 130 of semiconductor die 124 and encapsulant 154. A conductive layer 190 is formed over insulating layer 162 and is electrically connected to conductive layer 132 of semiconductor die 124. A portion of conductive layer 190 extends horizontally along insulating layer 162 and parallel to active surface 130 of semiconductor die 124 to laterally redistribute the electrical interconnect to conductive layer 132 of semiconductor die 124. Conductive layer 190 operates as a fan-out RDL, providing lateral or horizontal redistribution for the electrical signals of semiconductor die 124. Conductive layer 190 includes a planar surface 196 over which insulating layer 210 is formed. Insulating layer 210 is thinner than an insulating layer formed over a non-planar conductive layer. The thermal performance of Fo-WLCSP 362 is improved because build-up interconnect structure 226 can be made thinner with a thin insulating layer 210.

Conductive layer 190 includes a conductive micro via array 194 formed outside a footprint of semiconductor die 124. Conductive micro via array 194 includes one or more conductive micro vias 192. Conductive micro via array 194 extends from the horizontal portion of conductive layer 190 through insulating layer 162 to surface 160 of encapsulant 154. Therefore, conductive micro via array 194 is formed during the same process which forms build-up interconnect structure 226. The formation of conductive micro via array 194 does not require additional processing steps and results in a low cost method of forming a structure for alignment and dimension inspection of subsequently formed TMH.

A portion of encapsulant 154 and insulating layer 162 is removed over conductive micro via array 194 to form openings 260, which constitute a TMH. Openings 260 have a first diameter or cross-sectional width ranging from 180-270 μm, and a second diameter or cross-sectional width ranging from 180-450 μm. Thus, openings 260 have a stepped sidewall 262, and openings 260 constitute a TMH with a step-through-hole structure. The step-through-hole structure increases structural support and reduces damage to the package, including build-up interconnect structure 226, during processing, for example, during a desmearing process, solder capping, or a package-on-package stack soldering process.

Openings 260 expose conductive micro via array 194 and conductive micro vias 192 of conductive layer 190. Conductive micro via array 194 includes conductive micro vias 192 positioned for the inspection of the dimension of openings 260. Conductive micro via array 194 also includes conductive micro vias 192 formed in a pattern on conductive pad 200 and used to determine alignment of openings 260 over conductive pad 200. Conductive micro via array 194 improves the process of forming openings 260 by providing a simple and cost-effective method to set up laser 252 and to inspect openings 260. Fo-WLCSP 362 with conductive micro via array 194 has improved control over the alignment and dimensions of openings 260.

An electrically conductive bump material is deposited within openings 260 over conductive layer 190 to form bumps 350. Bumps 350 are formed over conductive layer 190 and over and between conductive micro vias 192 of conductive micro via array 194. Accordingly, a 3D interconnection for next level interconnection is formed through bumps 350, conductive layer 190, build-up interconnect structure 226, and semiconductor die 124. The 3D interconnection provides vertical electrical interconnection for semiconductor die 124 without a backside interconnect or RDL over a footprint of semiconductor die 124. Conductive micro vias 192 also provide a greater exposed surface area for conductive layer 190 and a more reliable vertical interconnection between conductive layer 190 and bumps 350.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
    providing a semiconductor die;
    depositing an encapsulant over a first surface of the semiconductor die and around the semiconductor die;
    forming a first insulating layer over a second surface of the semiconductor die opposite the first surface;
    forming a plurality of conductive vias through the first insulating layer;
    forming an interconnect structure over the semiconductor die and encapsulant; and
    forming a first opening in the encapsulant extending to the conductive vias.

2. The method of claim 1, further including forming a conductive bump within the first opening.

3. The method of claim 1, further including:
    inspecting the conductive vias through the first opening; and
    adjusting the semiconductor device based on a position of the conductive vias.

4. The method of claim 1, further including inspecting the conductive vias through the first opening to measure a dimension of the first opening.

5. The method of claim 1, further including determining a position of the conductive vias in the first opening.

6. A method of making a semiconductor device, comprising:
   providing a semiconductor die;
   depositing an encapsulant over the semiconductor die;
   forming a conductive via array over the encapsulant outside a footprint of the semiconductor die;
   forming a first opening in the encapsulant extending to the conductive via array; and
   determining a position of the conductive via array in the first opening.

7. The method of claim 6, further including forming an interconnect structure over the semiconductor die and encapsulant.

8. The method of claim 6, further including forming a conductive material within the first opening.

9. The method of claim 6, further including:
   inspecting the conductive via array through the first opening; and
   adjusting the semiconductor device based on the position of the conductive via array.

10. The method of claim 6, further including inspecting the conductive via array through the first opening to measure a dimension of the first opening.

11. The method of claim 6, further including forming the conductive via array in a circular or hexagonal pattern.

12. A semiconductor device, comprising:
    a semiconductor die;
    an encapsulant deposited over the semiconductor die;
    a plurality of first conductive vias formed over the encapsulant; and
    an opening formed through the encapsulant extending to the first conductive vias.

13. The semiconductor device of claim 12, further including an interconnect structure formed over the semiconductor die and encapsulant.

14. The semiconductor device of claim 12, further including a bump formed in the opening over the first conductive vias.

15. The semiconductor device of claim 12, further including a conductive pad formed over the first conductive vias.

16. The semiconductor device of claim 12, further including a plurality of second conductive vias formed adjacent to the first conductive vias over the encapsulant.

17. The semiconductor device of claim 16, wherein the first conductive vias are disposed in a staggered pattern.

18. The semiconductor device of claim 12, further including a conductive layer formed over the semiconductor die electrically connected to the first conductive vias.

19. A semiconductor device, comprising:
    a semiconductor die;
    an encapsulant deposited over the semiconductor die;
    a conductive via array formed over the encapsulant outside a footprint of the semiconductor die;
    an opening formed in the encapsulant over the conductive via array; and
    a conductive pad formed over the conductive via array.

20. The semiconductor device of claim 19, further including a bump formed in the opening over the conductive via array.

21. The semiconductor device of claim 19, wherein the conductive via array includes a plurality of conductive vias in a staggered position over the conductive pad.

22. A method of making a semiconductor device, comprising:
    providing a first semiconductor die;
    depositing an encapsulant over the first semiconductor die;
    forming a plurality of conductive vias over the encapsulant; and
    forming a first opening in the encapsulant extending to the conductive vias.

23. The method of claim 22, further including:
    providing a second semiconductor die; and
    depositing the encapsulant over the second semiconductor die.

24. The method of claim 22, further including depositing a conductive material in the first opening.

25. The method of claim 22, further including:
    inspecting the conductive vias through the first opening; and
    forming a second opening in the encapsulant based on a position of the conductive vias in the first opening.

26. The method of claim 22, further including forming a conductive pad over the conductive vias.

27. The method of claim 22, further including forming the plurality of conductive vias in a staggered position.

28. The method of claim 22, further including determining an alignment of the first opening by inspecting the conductive vias through the first opening.

29. The method of claim 22, further including determining a dimension of the first opening by inspecting the conductive vias through the first opening.

* * * * *